US008680935B2

(12) United States Patent
Muir

(10) Patent No.: US 8,680,935 B2

(45) Date of Patent: Mar. 25, 2014

(54) HIGH FREQUENCY COAXIAL BALUN AND TRANSFORMER

(75) Inventor: John Muir, North Chelmsford, MA (US)

(73) Assignee: Auriga Measurement Systems, LLC, Chelmsford, MA (US)

( * ) Notice: Subject to any disclaimer, the term of this patent is extended or adjusted under 35 U.S.C. 154(b) by 376 days.

(21) Appl. No.: 13/108,160

(22) Filed: May 16, 2011

(65) Prior Publication Data

US 2012/0293273 A1 Nov. 22, 2012

(51) Int. Cl.

*H03H 7/42* (2006.01)

*H03H 5/00* (2006.01)

(52) U.S. Cl.

USPC .......................................... 333/26; 333/132

(58) Field of Classification Search

USPC ..................... 333/25, 26, 125, 132, 134, 136

See application file for complete search history.

(56) References Cited

U.S. PATENT DOCUMENTS 5,379,006 A 1/1995 McCorkle

2007/0285168 A1 12/2007 Dishop

FOREIGN PATENT DOCUMENTS

WO WO 00/60694 10/2000

OTHER PUBLICATIONS

PCT Search Report of the ISA for PCT/US2012/0036710 dated Aug. 2, 2012.

Written Opinion of the ISA for PCT/US2012/036710 dated Aug. 2, 2012.

*Primary Examiner* — Dean O Takaoka

(74) *Attorney, Agent, or Firm* — Daly, Crowley, Mofford & Durkee, LLP

(57) ABSTRACT

An RF circuit includes a balun circuit comprised of a coaxial cable having a desired characteristic impedance and having a first port coupled to a first port of said RF circuit and a second port and a transformer circuit having a first port coupled to the second port of the balun. The transformer circuit is comprised of a pair of coaxial cables, each having a desired characteristic impedance and each having a ferrite coupled thereto. The interconnects between center conductors and outer conductors in the transformer are made symmetrical such that a resonance with a frequency determined by the inductance and capacitance of the coaxial cables does not occur, preventing any nulls in an insertion loss characteristic of the RF circuit. The ferrite is selected to act as a circuit element having an impedance characteristic which is higher than the impedance characteristic of the coaxial cable.

9 Claims, 7 Drawing Sheets

HIGH FREQUENCY COAXIAL BALUN AND TRANSFORMER

STATEMENT REGARDING FEDERALLY SPONSORED RESEARCH

This invention was made with Government support under N68335-09-C-0055 awarded by the Department of the Navy. The Government has certain rights in this invention.

CROSS REFERENCE TO RELATED APPLICATION

Not applicable.

FIELD OF THE INVENTION

The structures and techniques described herein relate to radio frequency (RF) circuits and more particularly to balun and impedance transformer circuits provided from coaxial cables.

BACKGROUND OF THE INVENTION

As is known in the art, balun circuits (or more simply "baluns") and transformer circuits are often used with high frequency (HF) circuits, such as amplifiers, to link a symmetrical (balanced) circuit to an asymmetrical (unbalanced) circuit.

SUMMARY OF THE INVENTION

In accordance with the concepts, circuits and techniques described herein, an RF circuit includes a balun circuit comprised of a coaxial cable having a desired characteristic impedance and having a first port coupled to a first port of the RF circuit and a second port. The RF circuit further includes a transformer circuit having a first port coupled to the second port of the balun. The transformer circuit is comprised of a pair of coaxial cables, each having a desired characteristic impedance and each having a ferrite coupled thereto. Interconnects between center conductors and outer conductors in the transformer are made symmetrical such that inductance of the coaxial cables do not result in any nulls in an insertion loss characteristic of the RF circuit. The ferrite is selected to act as a circuit element having an impedance characteristic which is higher than the impedance characteristic of the transformer coaxial cable to thereby extend the lower end of the frequency response of the transformer circuit and thus the RF circuit.

In accordance with a further concept, described herein is a process for determining physical configurations of a coaxial cable for use in a transformer circuit. The process comprises given a desired frequency range, desired insertion loss, capacitance per unit length, and inductance per unit length, determining a maximum cable length allowed to prevent nulls in response from being in the operational frequency band using the equation for a resonant LC circuit. Nulls in the insertion loss response occur when there are different connection lengths between the center and outer conductors on the two sides of the 4:1 transformer. The frequency of the first null can be determined by the following equation:

$$\text{null frequency}=1/(2\pi*\sqrt{(L*C/2)})$$

where

L=inductance of coaxial cable

C=capacitance of coaxial cable

Nulls will also appear at odd harmonics (3x, 5x, 7x, . . . ) of the frequency determined in the equation above. Physical dimensions of the circuit can be designed to prevent nulls from appearing in the operating frequency range.

DETAILED DESCRIPTION OF THE PREFERRED EMBODIMENTS

Figure 1:
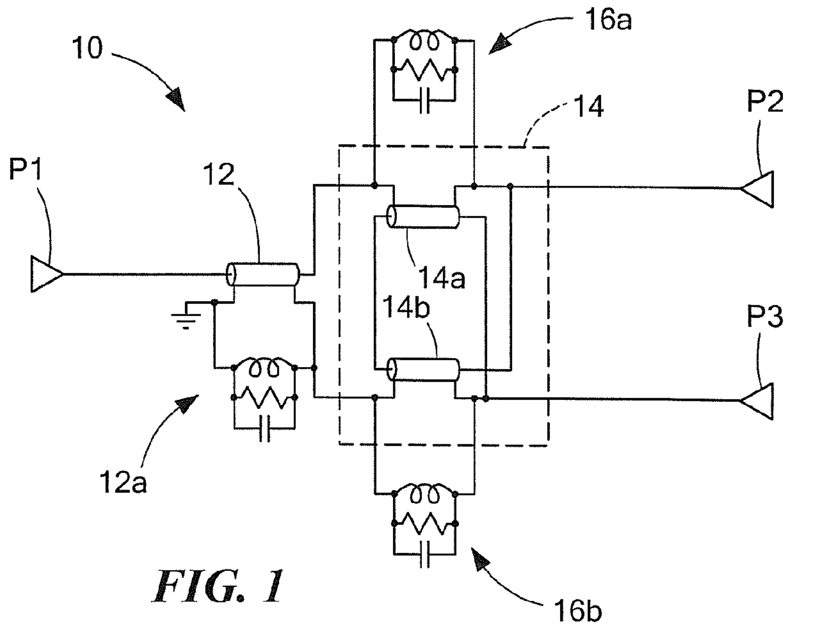
FIG. 1 is a schematic diagram of a radio frequency (RF) circuit comprising a balun circuit and a transformer circuit.

Referring now to FIG. 1, a radio frequency (RF) circuit 10 includes a balun 12 comprised of a ferrite 12*a* and a transformer circuit 14 comprised of RF transformers 14*a*, 14*b*. Transformers 14*a*, 14*b* comprise respective ones of ferrites 16*a*, 16*b*. It should be appreciated that in FIG. 1 ferrites 12*a*, 16*a*, 16*b* are illustrated as parallel RLC circuits. Ferrites 16*a*, 16*b* provide transformer 14 having a desired impedance characteristic at RF frequencies below the range over which transformer 14 would otherwise operate (i.e. inclusion of ferrites 16*a*, 16*b* increases the operating frequency range of transformer 14 and in particular ferrites 16*a*, 16*b* help extend the lower end of the operating frequency range). Ferrite 12*a* also contributes to extending the lower frequency range of the RF circuit 10. The ferrite equivalent inductance determines the low frequency roll-off. The insertion loss of the balun and transformer circuit is dominated by the ferrite equivalent resistance. The larger the resistance the lower the insertion loss. High-frequency roll-off is influenced by the ferrite equivalent capacitance.

In one embodiment, balun 12 and transformer 14 are implemented with coaxial cables having a desired characteristic impedance and the ferrites are selected to act as a circuit element having a relatively high impedance characteristic over a very a relatively wide bandwidth (e.g. a fractional bandwidth above 20:1 or in the range of about 100:1, for example, from 30 MHz to above 2.5 GHz).

In one embodiment the coaxial cable for balun 12 is provided having a 50 ohm characteristic impedance and the coaxial cable for transformer 14 is implemented with 25 ohm coaxial cable. In this embodiment, the single ended impedance, at a first port P1 in FIG. 1, is 50 ohms. The balanced impedance, between ports P2 and P3, is 12.5 ohms. This 12.5 ohm balanced impedance is equivalent to 6.25 ohms to each of the balanced ports (2 and 3) to ground. In this case, the RF circuit 10 comprising balun 12 provided as a 1:1 balun and transformer 14 provided as a 4:1 transformer provides a low loss, broadband balanced to unbalanced conversion and 4:1 impedance transformation. In one embodiment, the ferrites may be provided as toroidal ferrites of the type marketed by Wurth Electronic and identified with part number 74270111 (ferrite base material is 4 W 620). It should be appreciated, of course, that other ferrites having the same or similar characteristics may also be used.

It should be appreciated that FIG. 1 does not take into account the effects of interconnects between the center conductors and outer conductors in the 4:1 transformer. Imbalances in the inductance of such interconnects creates a resonance at a frequency determined by the capacitance and inductance of the coaxial cables and thus create nulls in the insertion loss response of the RF circuit 10. This is a reflective loss due to a high return loss at the null frequency.

It has been recognized in accordance with the concepts, circuits and techniques described herein that if the inductance of such interconnects is substantially symmetrical, then nulls in the insertion loss response of the RF circuit 10 are significantly reduced. Ideally, if the inductance of interconnects is perfectly symmetrical, then the interconnects do not generate any nulls in the insertion loss response of the RF circuit 10. Thus, it has been recognized that accurate assembly is critical for high-frequency performance.

The upper end of the frequency response of the circuit is limited by: (1) length of the cables (longer cable results in larger capacitance and inductance); and (2) center conductor to outer conductor connections on transformer and asymmetry between the two sides of the transformer Referring now to FIG. 2, in which like elements of FIG. 1 are provided having like reference designations, an RF circuit 20 includes balun 12, ferrite 12*a*, transformer circuit 14 comprised of RF transformers 14*a*, 14*b* and ferrites 16*a*, 16*b* and further includes inductors L1 and L2 which represent the effect of the interconnections between the center and outer conductors of the two coaxial transformer cables 14*a*, 14*b*. The connections are made with the center conductors of the transformer cables where the outer conductor is removed at the end of the cable. The center conductor of each coaxial cable is coupled to the proper outer conductor. The center conductors of each coaxial cable may be coupled to the outer conductors via soldering, bonding, conductive epoxy, or using any other attaching or joining techniques known to those of ordinary skill in the art. Soldering with tin-lead solder is the preferred attachment technique in order to minimize the inductance and loss of the connection.

Figure 2:
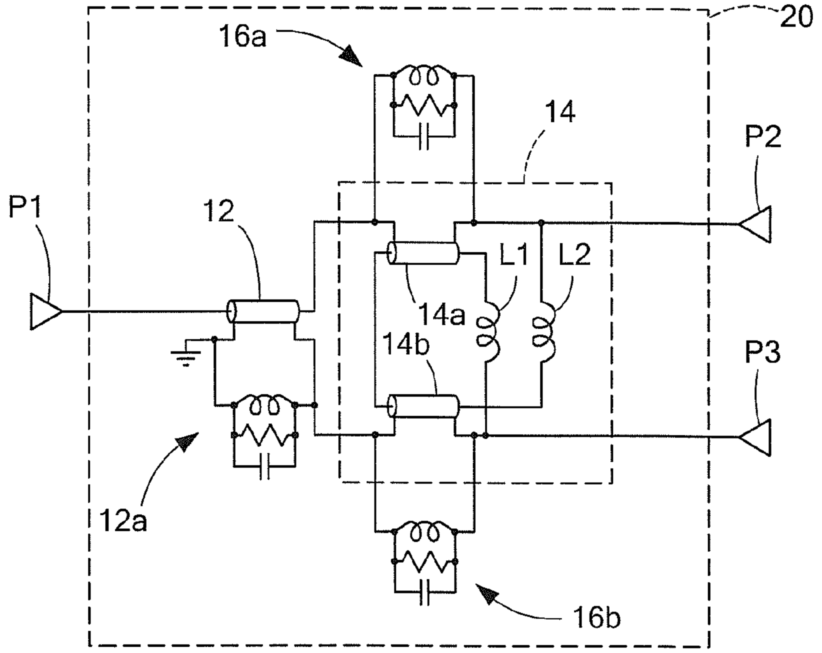
FIG. 2 is a schematic diagram of an RF circuit comprising balun and transformer circuits and having circuit elements which account for effects of the interconnection between the balun and transformer circuits.
Figure 3:
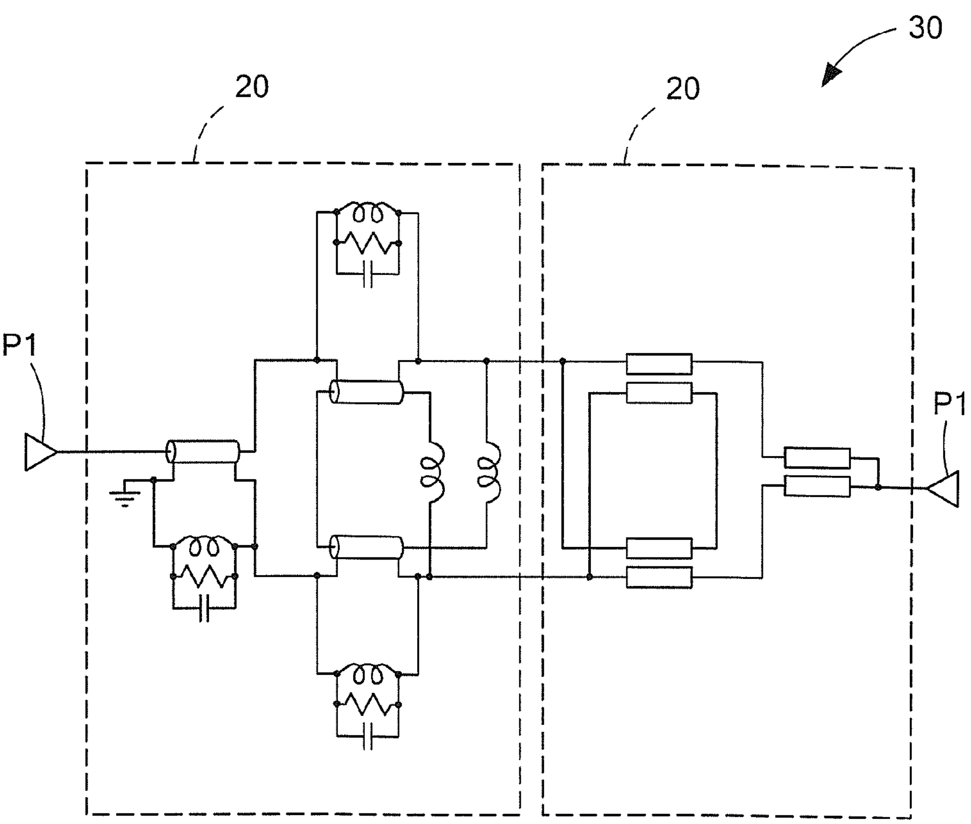
FIG. 3 is a schematic diagram of a back-to-back balun and transformer circuit used for simulation.

Referring now to FIG. 3, in which like elements of FIG. 2 are provided having like reference designations, a circuit 30 comprises of a pair of baluns 20 (FIG. 2) coupled in a back-to-back circuit configuration. Computer simulation of circuit 30 were performed to demonstrate the effects discussed above. The three TLINP4 models (i.e. 4-terminal physical transmission line models provided by Agilent Technologies, Santa Clara, Calif.) are used to create an ideal balun and transformer to transfer the impedance back to 50 ohms so insertion loss of a single balun and transformer can be evaluated.

Figure 4:
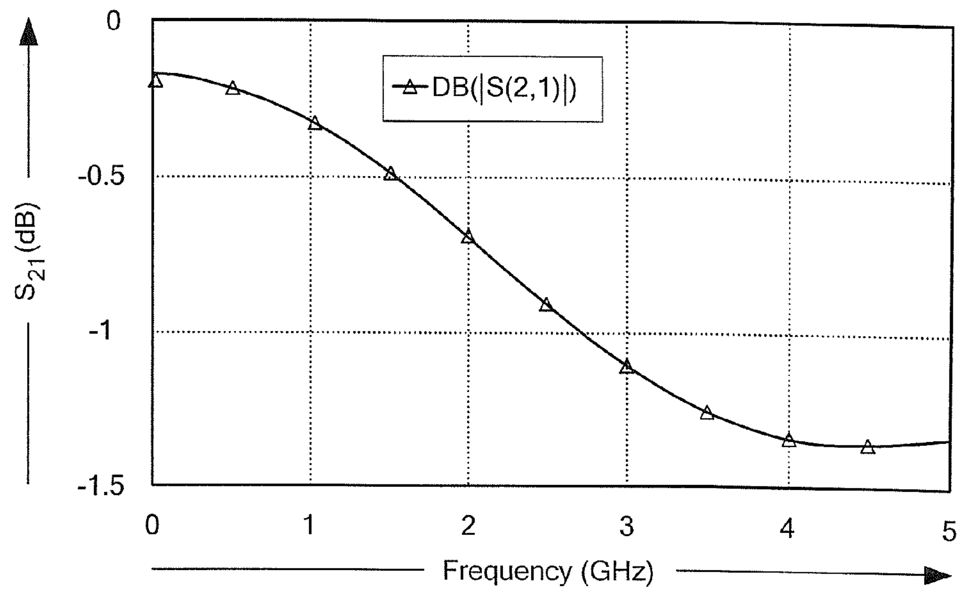
FIG. 4 is a plot of insertion loss vs. frequency for a back-to-back balun and transformer circuit with equal interconnect inductance.

Referring now to FIG. 4, insertion loss simulation results of the circuit in FIG. 3 when the two interconnect inductances L1 and L2 between the center and outer conductors of the transformer are the same are shown. As can be seen from FIG. 4, the insertion loss varies from about 0.25 dB to about 1.4 dB over a frequency range of about 30 MHz-5 GHz.

Figure 5:
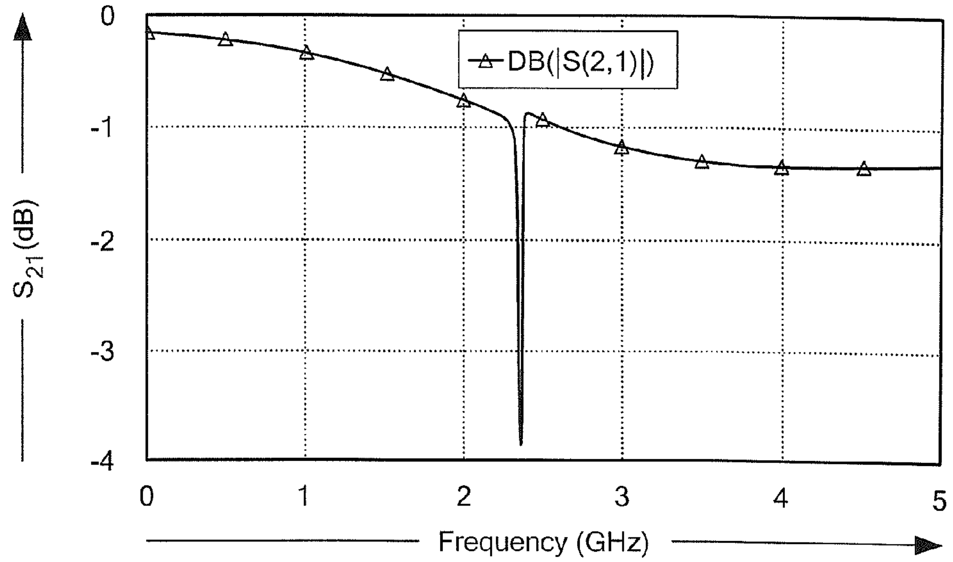
FIG. 5 is a plot of insertion loss vs. frequency for a back to back balun and transformer circuit with unequal interconnect inductance.

Referring now to FIG. 5, the insertion loss simulation results of the circuit in FIG. 3 when the two interconnect inductances L1 and L2 are different values. This may be caused, for example, by different connection lengths between the center and outer conductors on the two sides of the 4:1 transformer. A significant null in the insertion loss response appears at approximately 2.5 GHz. The frequency of the null is determined by the transformer coaxial cable capacitance and inductance. The depth of the null depends on the values of the interconnect inductances and the difference between them. The frequency of the null can be determined by the following equation:

$$\text{null frequency}=1/(2\pi*\sqrt{(L*C/2)})$$

where

L=inductance of coaxial cable

C=capacitance of coaxial cable

Nulls will also appear at odd harmonics (3x, 5x, 7x, . . . ) of the frequency determined in the equation above. Cable capacitance per unit length and cable inductance per unit length is typically provided by a cable manufacturer on a datasheet and can be used to determine the capacitance and inductance given the length of the cable. The maximum length of transformer coaxial cable can be derived from the null frequency equation and is given by:

$$\text{maximum length}=1/(\pi*f_{max}*\sqrt{(2*L'C')})$$

where $f_{max}$=maximum operating frequency

L'=inductance per unit length

C'=capacitance per unit length

Figure 6:
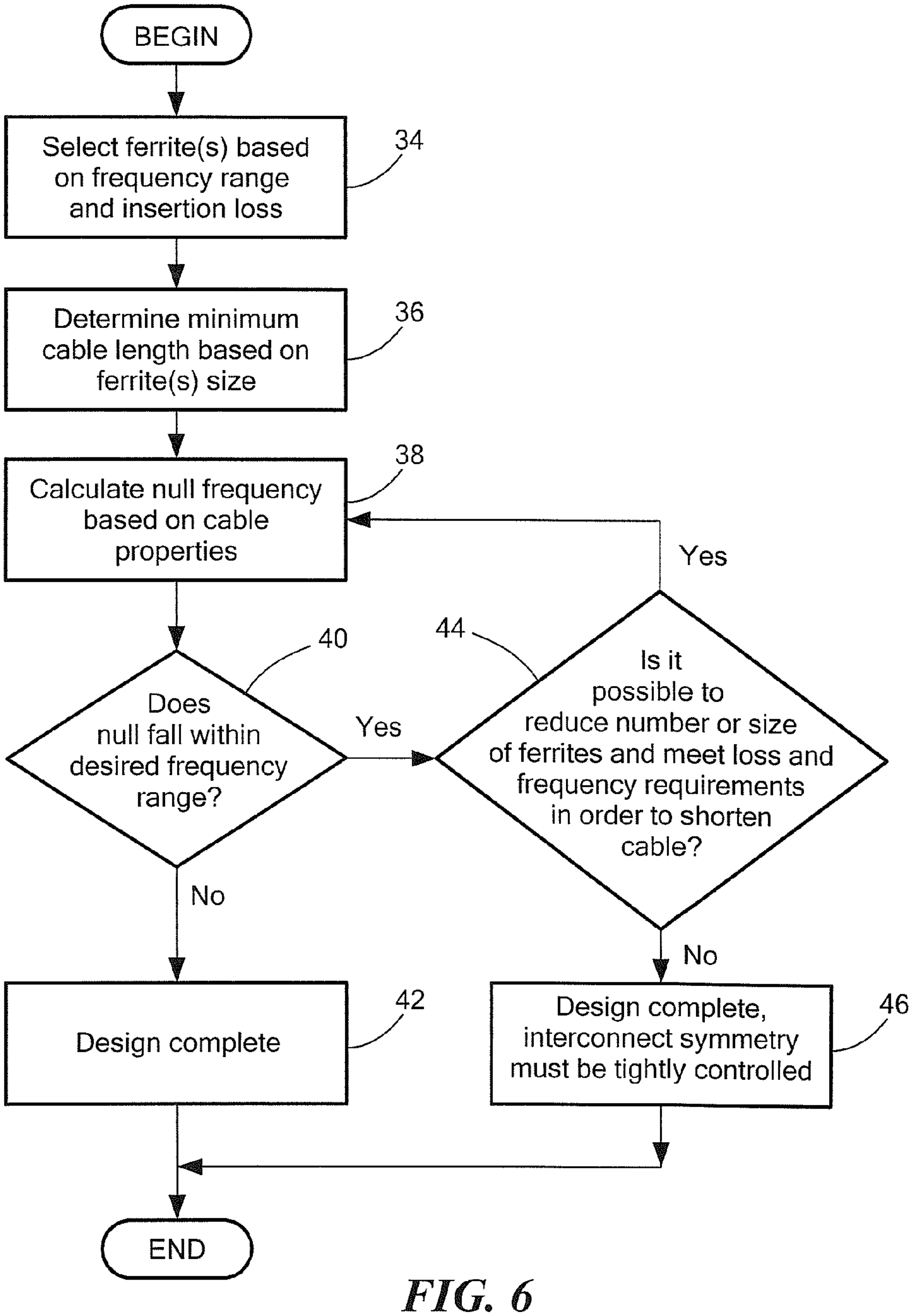
FIG. 6 is a flow diagram, which illustrates a process to determine physical configurations of a coaxial cable for use in a transformer circuit.

Referring now to FIG. 6, a process for determining physical configurations begins as shown in processing block 34, by selecting ferrites based upon a given frequency range and a maximum allowable insertion.

The process then includes determining the minimum cable length based upon ferrite(s) size as shown in processing block 36. The process then includes calculating a null frequency based upon cable properties as shown in processing block 38.

Processing then proceeds to decision block 40 where a decision is made as to whether the null frequency falls within the desired frequency range.

If a decision is made that the null frequency does not falls within the desired frequency range, then processing proceeds to processing block 42 and the design is complete.

If, however, the null frequency falls within the desired frequency range, then processing proceeds to decision block 44 where a decision is made as to whether it is possible to reduce number or size of ferrites and meet loss and frequency requirements in order to shorten the cable.

If is it determined that it is possible to reduce number or size of ferrites and meet loss and frequency requirements then processing flows back to blocks 38 and 40 and this loop is repeated until one of processing blocks 42 or 46 is reached.

It should be noted that: (1) interconnect inductance can be determined from the straight wire inductance formula (which calculates inductance of a round conductor based on diameter and length).

Figure 7:
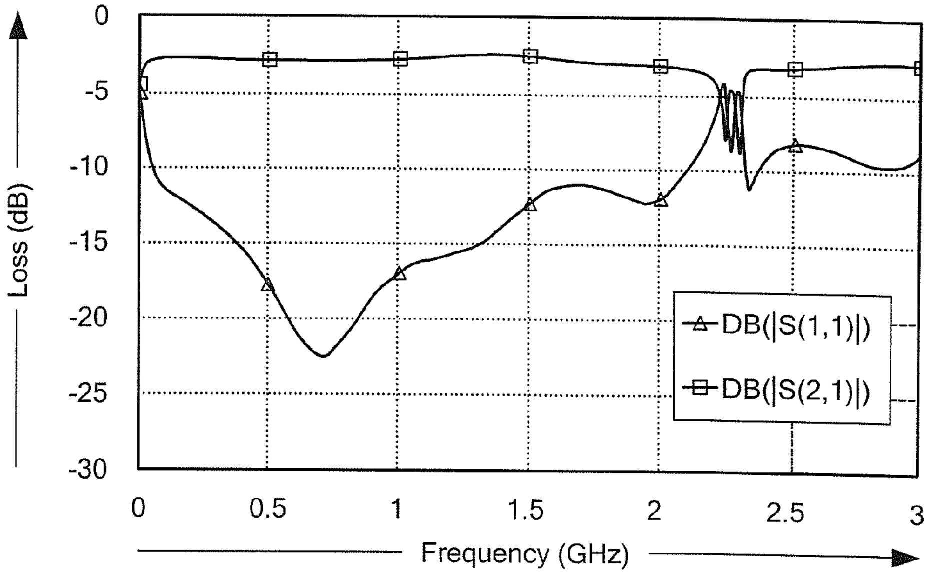
FIG. 7 is a plot of measured insertion loss and return loss vs. frequency for a back to back balun and transformer test fixture circuit with flat insertion loss up to 2 GHz.

Referring now to FIG. 7, a plot of insertion loss for a back-to-back circuit configuration is shown. It should be noted that the circuit has a substantially flat insertion loss characteristic and a return loss characteristic greater than 10 dB from about 50 MHz to about 2 GHz. Cable lengths for balun and transformer are approximately 1 inch.

Figure 8:
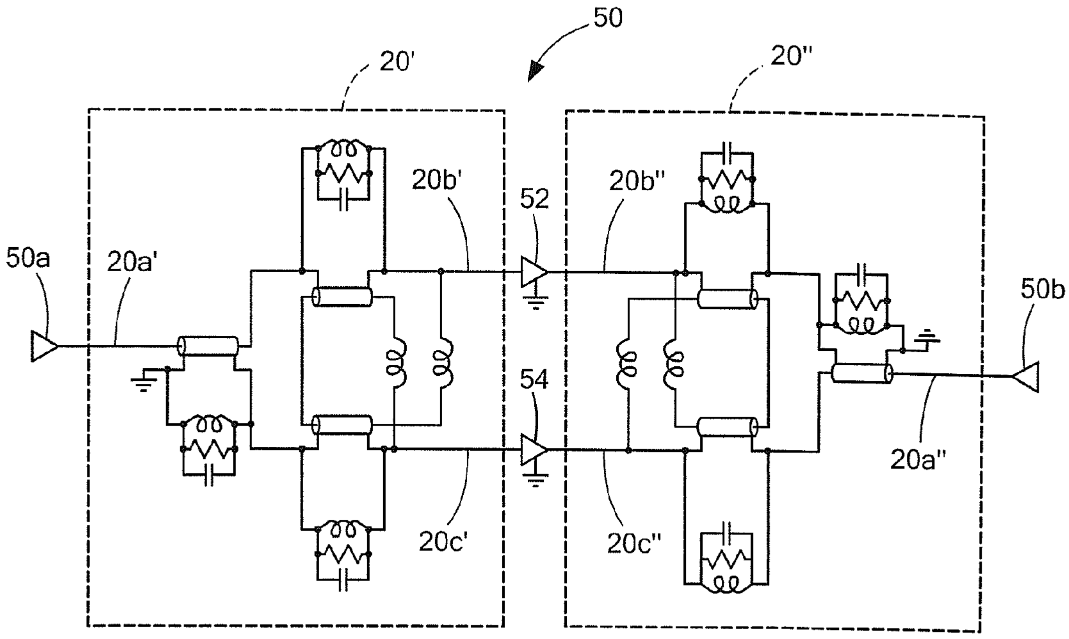
FIG. 8 is a schematic diagram of an RF push-pull amplifier circuit comprising a pair of balun and transformer circuits of the type described in conjunction with FIG. 2.

Referring now to FIG. 8, a push pull RF amplifier circuit 50 having an RF input port 50*a* and an RF output port 50*b* comprises a first coaxial balun-transformer circuit 20' having an RF port 20*a*' coupled to the port 50*a* of RF push-pull amplifier 50 and a pair of RF ports 20*b*', 20*c*' coupled to respective ones of RF input ports of a pair of RF amplifiers 52, 54. First coaxial balun-transformer circuit 20' improves an impedance match between the RF input 50*a* of amplifier circuit 50 and the input ports of RF amplifiers 52, 54. Coaxial balun-transformer circuit 20' may be the same as or similar to balun-transformer circuit 20 described above in conjunction with FIG. 2. It should be noted that the effective impedance between 20*b*' and 20*c*' is one-half of the characteristic impedance of the transformer coaxial cable.

Output ports of respective ones of the RF amplifiers 52, 54 are coupled to ports 20*b*", 20*c*" of a second coaxial balun-transformer circuit 20". Coaxial balun-transformer circuit 20" may be the same as or similar to balun-transformer circuit 20 described above in conjunction with FIG. 2. A third port 20*c*" of coaxial balun-transformer circuit 20" is coupled to port 50*b* of RF push-pull amplifier circuit 50. Second coaxial balun-transformer circuit 20" improves an impedance match between the RF output ports of RF amplifiers 52, 54 and the RF output port 50*b* of amplifier circuit 50. It should be noted that the effective impedance at 20*b*" and 20*c*" is one-half the characteristic impedance of the transformer coaxial cable.

The impedance matching provided by the first and second coaxial balun-transformer circuits results in an RF amplifier 50 having insertion loss and return loss characteristics (at both the amplifier input and output ports 50*a*, 50*b*) which are improved when compared to insertion loss and return loss characteristics which can be achieved without the first and second coaxial balun-transformer circuits 20', 20". The balun-transformer circuit 20' on the input side provides 180 degree phase difference power split Amplifiers 52 and 54 are driven 180 degrees out of phase. The balun-transformer circuit 20" on the output side functions as a 0-180 degree power combiner summing the output of amplifiers 52 and 54.

Figure 9:
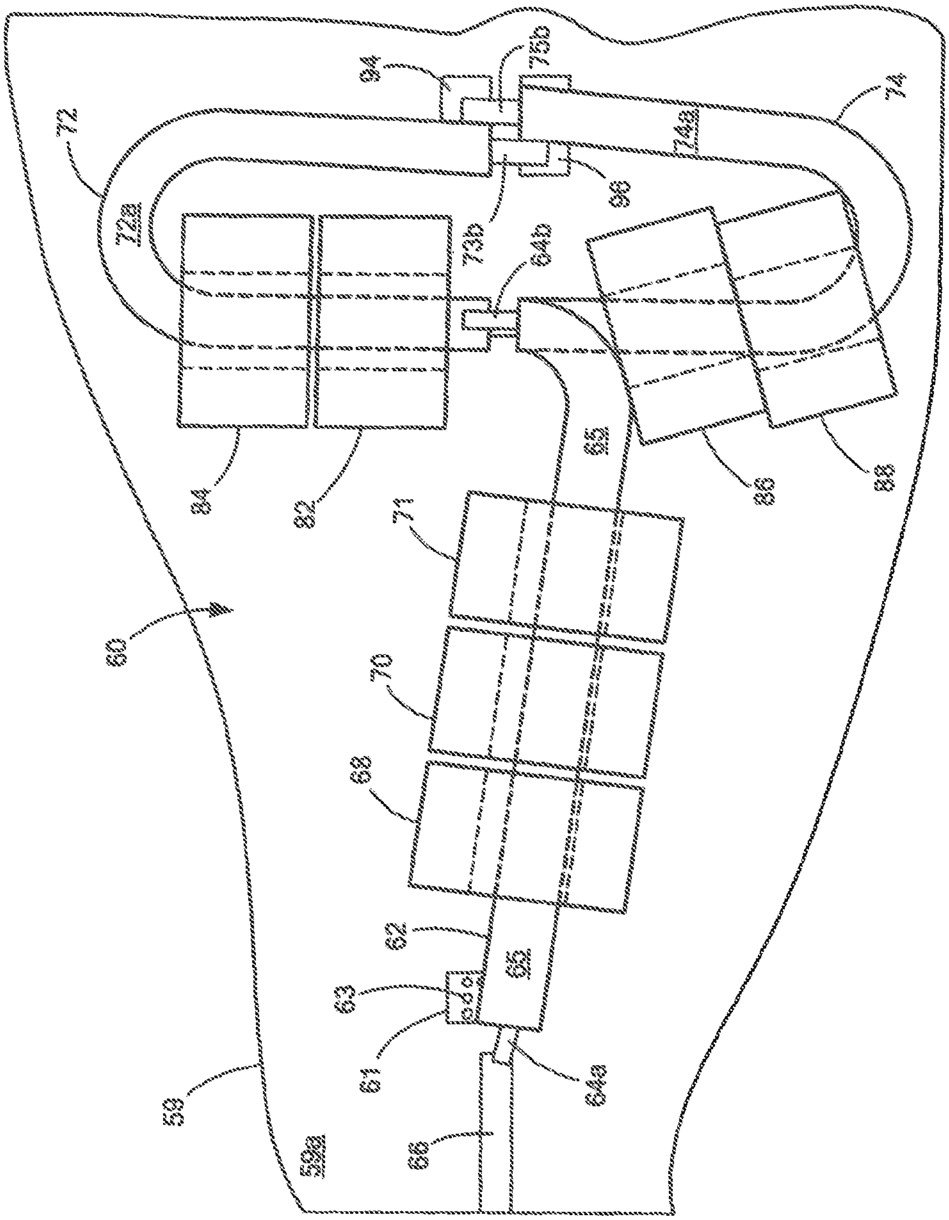
FIG. 9 is a diagram of a balun and transformer circuit implemented with coaxial cables and ferrites having a toroidal shape.

Referring now to FIG. 9, a substrate 59 has a coaxial balun-transformer circuit 60 disposed on a first surface 59*a* thereof. A second opposing surface of substrate 59 has a ground plane provided thereon (the ground plane is not visible in FIG. 9).

Coaxial balun-transformer circuit 60 comprises a balun portion provided from a coaxial cable 62 having an inner (or center) conductor 64 having first and second ends 64*a*, 64*b* and an outer conductor 65. Outer conductor 65 is electrically coupled to ground. In this exemplary embodiment, this is accomplished by electrically coupling outer conductor to a conductive pad 61. Pad 61 is provided having via holes 63 therein which are coupled to the ground plane of substrate 59. o provided therein (e.g. via soldering or conducive epoxy or outer conductor case.

A first end of center conductor 64 is coupled to a first end of a transmission line 66 provided on surface 59*a* of substrate 59. In one embodiment, substrate 59 is provided having a thickness of about 0.020 inch and transmission line 66 is provided having a 50 ohm impedance characteristic at frequencies of interest. A second surface of substrate 68 is provided having a ground plane (not visible in FIG. 9) disposed thereover. Thus, in this exemplary embodiment, transmission line 66 is provided as a microstrip transmission line. In one embodiment, the thickness and electrical characteristics as well as the width of transmission line 66 are selected such that transmission line 66 is provided having a characteristic impedance of 50 ohms (Ω).

A second end of transmission line 66 terminates at an edge of substrate 59. An RF connector may be coupled to the substrate and thus coupled to balun-transformer circuit 60 via transmission line 66.

Referring again to FIG. 9, second end 64*b* of center conductor 64 is coupled to an outer conductor 72*a* a first coaxial cable 72. Outer conductor 65 is coupled to an outer conductor 74*a* of a second coaxial cable 74.

Coaxial cables 72, 74 are each provided have respective inner (or center) conductors 73, 75 with each of the center conductors 73, 75 having respective first and second ends 73*a*, 73*b*, 75*a*, 75*b* and outer conductors 62*a*, 74*a*. The first end 73*a* of center conductor 73 is coupled to the first end of center conductor 75*a* and the second end 73*b* of center conductor 73 is coupled to outer conductor 74*a* of coaxial cable 74. Similarly, the second end 75*b* of center conductor 75 is coupled to outer conductor 72*a* of coaxial cable 72. Thus, with the center conductor of each coaxial cable coupled to the proper outer conductor, coaxial cables 72, 74 form a transformer circuit. As shown in FIG. 9. outer conductors 72*a*, 74*a* are each coupled to pads 94, 96 which provide connection regions to the transformer.

It should be appreciated that the bend radius of each coaxial cable 72, 74 is selected to be substantially the same thus making each side of the transformer symmetric. As can be seen in FIG. 9, the radii of the bends are substantially the same and the ends of each coaxial the cable may be bent slightly to facilitate alignment (and connection) of the respective center conductors to the respective outer conductors. The length of each side of the cable should be substantially the same for the transformer to function properly.

It should also be understood that another goal is to keep the coaxial lines as short as possible. In one embodiment, the coaxial cables 62, 72, 74 for the balun and transformer are shorter than about one and one-half (1.5) inches. In preferred embodiments, the coaxial cables 62, 72, 74 for the balun and transformer are shorter than about one (1.0) inch. In most preferred embodiments, the coaxial cables 62, 72, 74 for the balun and transformer are shorter than about one-half (0.5) inch.

It should also be appreciated that the center conductors of each coaxial cable may be coupled to the outer conductors via soldering with soldering using a tin-lead solder being the preferred attachment technique in order to maintain a relatively small inductance and insertion loss of the connection. Those of ordinary skill in the art will appreciate, of course, that bonding, conductive epoxy, any other attaching or joining techniques may also be used to provide an electrical connection.

It has been recognized in accordance with the concepts, circuits and techniques described herein that if the inductance of such interconnects is substantially symmetrical, then nulls in the insertion loss response of the balun transformer circuit 60 may be significantly reduced. Ideally, if the inductance of interconnects is perfectly symmetrical, then the inductances of the interconnects do not generate any nulls in the insertion loss response of the RF circuit 60. Thus, it has been recognized that accurate assembly is critical for high-frequency performance.

Ferrites 82, 84, 86, 88 are disposed about coaxial cables 72, 74. The balun and transformer are implemented with coaxial cables 62, 72, 74 having a desired characteristic impedance and the ferrites 68, 70, 82, 84, 86, 88 are selected to act as a circuit element having a relatively high impedance characteristic over a very a relatively wide bandwidth (e.g. a fractional bandwidth above 20:1 or in the range of about 100:1, for example, from 30 MHz to above 2.5 GHz).

In one embodiment coaxial cable 62 is provided having a 50 ohm characteristic impedance and the coaxial cables 72, 74 for the transformer are provided having a characteristic impedance of 25 ohms. In this embodiment, the single ended impedance, at a first port 64*a* is 50 ohms. The balanced impedance at the other two ports, 94 and 96, is 12.5 ohms. This 12.5 ohm balanced impedance is equivalent to 6.25 ohms to each of the balanced ports to ground. In this case, the RF circuit 60 includes balun 62 provided as a 1:1 balun and transformer provided from coaxial cables 72, 74 as a 4:1 transformer. This results in a relatively low loss, broadband balanced to unbalanced conversion and 4:1 impedance transformation.

In one embodiment, ferrites 68, 70, 71, 82, 84, 86, 88 may be provided as toroidal ferrites of the type marketed by Wurth Electronic and identified with part number 74270111 (ferrite base material is 4 W 620). It should be appreciated, of course, that other ferrites having the same or similar characteristics may also be used.

It should be understood that after reading the description provided herein, those of ordinary skill in the art will appreciate how to select coaxial cables and ferrites to meet the needs of a particular application and which provide a desired result.

Figure 10:
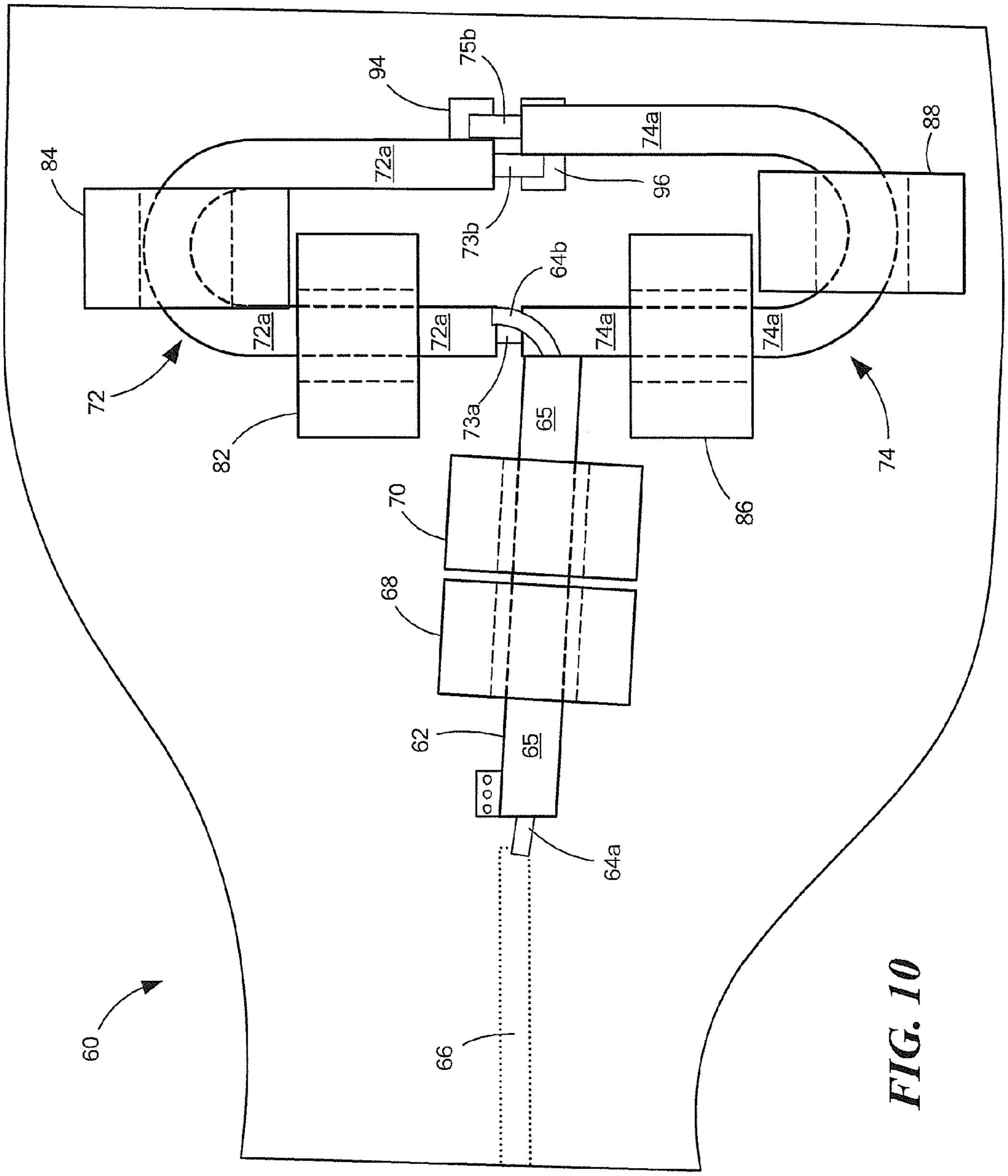
FIG. 10 is a diagram of an alternate embodiment of a balun and transformer circuit implemented with coaxial cables and ferrites having a toroidal shape.

Referring now to FIG. 10, in which like elements of FIG. 9 are provided having like reference designations, coaxial balun utilizes two ferrites 68, 70 and ferrites 82, 84, 86, 88 are disposed over different regions of coaxial transformer sections 72, 74 than as shown in FIG. 9. The ferrite positions are selected based primarily upon mechanical constraints. Thus, it should be appreciated that the particular number of ferrites to use in any application and the physical placement of the ferrites is selected based upon the particular application and physical implementation of the balun and transformer circuits and those of ordinary skill in the art will appreciate how to select and position the ferrites to satisfy the needs of a particular application.

Having described preferred embodiments which serve to illustrate various concepts, circuits and techniques which are the subject of this patent, it will now become apparent to those of ordinary skill in the art that other embodiments incorporating these concepts, circuits and techniques may be used. For example, described herein is a specific exemplary circuit topology and specific circuit implementation for achieving a desired performance. It is recognized, however, that the concepts and techniques described herein may be implemented using other circuit topologies and specific circuit implementations. Accordingly, it is submitted that that scope of the patent should not be limited to the described embodiments but rather should be limited only by the spirit and scope of the following claims.

What is claimed is:

1. An RF circuit having first, second and third ports, the RF circuit comprising:

a balun circuit comprised of a coaxial cable having a desired characteristic impedance, said balun circuit having a first port coupled to the first port of said RF circuit and a second port;

a transformer circuit having a first port coupled to the second port of said balun, said transformer circuit comprised of a pair of coaxial cables, each coaxial cable having a desired characteristic impedance and each one of said pair of coaxial cables having a ferrite coupled thereto wherein said ferrite is selected to act as a circuit element having an impedance characteristic which is higher than the impedance characteristic of said coaxial cable wherein interconnects between center conductors and outer conductors in the transformer are made such that asymmetry of the interconnects do not generate any nulls in an insertion loss characteristic of the RF circuit.

2. The circuit of claim 1 wherein the balun is provided as a 1:1 balun and the transformer is provided as a 4:1 transformer.

3. The circuit of claim 1 wherein said ferrite is selected to act as a circuit element having an impedance characteristic which is higher than the impedance characteristic of said coaxial cable over a fractional bandwidth in the range of about 20:1 to about 100:1.

4. The circuit of claim 1 wherein said ferrite is selected to act as a circuit element having an impedance characteristic which is higher than the impedance characteristic of said coaxial cable over a frequency range of about 30 MHz to about 2.5 GHz.

5. The circuit of claim 1 wherein said ferrite is selected to act as a circuit element having an impedance characteristic which is higher than the impedance characteristic of said coaxial cable over a frequency above 2.5 GHz.

6. The circuit of claim 1 wherein said balun operates at RF frequencies above 1 GHz.

7. The circuit of claim 1 wherein the coaxial cables for said balun and said transformer are shorter than about one and on-half (1.5) inches.

8. The circuit of claim 1 wherein the coaxial cables for said balun and said transformer are shorter than about one (1) inch.

9. The circuit of claim 1 wherein the coaxial cables for said balun and said transformer are shorter than one-half (½) inch.

* * * * *